(12) United States Patent
Van Der Ham et al.

(10) Patent No.: US 8,441,610 B2
(45) Date of Patent: *May 14, 2013

(54) ASSEMBLY COMPRISING A CONDITIONING SYSTEM AND AT LEAST ONE OBJECT, A CONDITIONING SYSTEM, A LITHOGRAPHIC APPARATUS AND METHODS

(75) Inventors: Ronald Van Der Ham, Maarheeze (NL); Tjarko Adriaan Rudolf Van Empel, Eindhoven (NL); Herman Vogel, Sandy Hook, CT (US); Niek Jacobus Johannes Roset, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 214 days.

This patent is subject to a terminal disclaimer.

(21) Appl. No.: 13/084,372

(22) Filed: Apr. 11, 2011

(65) Prior Publication Data

US 2011/0188049 A1 Aug. 4, 2011

Related U.S. Application Data

(63) Continuation of application No. 11/389,493, filed on Mar. 27, 2006, now Pat. No. 7,924,399.

(51) Int. Cl.
| | |
|---|---|
| *F03B 11/02* | (2006.01) |
| *F15B 13/00* | (2006.01) |
| *F16L 3/01* | (2006.01) |
| *G03B 27/52* | (2006.01) |
| *G03B 27/32* | (2006.01) |
| *G03B 27/42* | (2006.01) |

(52) U.S. Cl.
USPC ............. 355/30; 137/561 R; 355/53; 355/77

(58) Field of Classification Search . 137/561 R; 355/30, 355/53, 72, 75, 77; 359/395, 512
See application file for complete search history.

(56) References Cited

U.S. PATENT DOCUMENTS

| | | |
|---|---|---|
| 3,782,050 A | 1/1974 | Dowdell et al. |
| 6,730,631 B1 | 5/2004 | Eberle et al. |

(Continued)

FOREIGN PATENT DOCUMENTS

| | | |
|---|---|---|
| EP | 0 498 499 | 8/1997 |
| JP | 62-288433 A | 12/1987 |

(Continued)

OTHER PUBLICATIONS

English-Language Translation of Office Action of the IPO directed to related Taiwanese Patent Application No. 096108821, mailed Aug. 24, 2011, from the Taiwan Intellectual Property Office; 10 pages.

(Continued)

*Primary Examiner* — Hung Henry Nguyen
*Assistant Examiner* — Colin Kreutzer
(74) *Attorney, Agent, or Firm* — Sterne, Kessler, Goldstein & Fox P.L.L.C

(57) ABSTRACT

An assembly including a conditioning system and an object moveable into and/or out of an area to be conditioned is disclosed. The conditioning system has fluid outlet passages to supply conditioning fluid to the area to be conditioned and is configured to adjust outflow of the conditioning fluid from the fluid outlet passages depending on a position of the object.

20 Claims, 4 Drawing Sheets

U.S. PATENT DOCUMENTS

| | | |
|---|---|---|
| 6,736,556 B2 | 5/2004 | Kanagawa |
| 6,890,080 B2 | 5/2005 | Kalley et al. |
| 7,375,791 B2 | 5/2008 | Vogel et al. |
| 7,924,399 B2 | 4/2011 | Van Der Ham et al. |
| 2005/0140384 A1 | 6/2005 | Andrews et al. |
| 2006/0139594 A1 | 6/2006 | Hara et al. |
| 2009/0266937 A1 | 10/2009 | Frankenberger et al. |

FOREIGN PATENT DOCUMENTS

| | | |
|---|---|---|
| JP | 05-126522 A | 5/1993 |
| JP | 05-283313 A | 10/1993 |
| JP | 10-125584 A | 5/1998 |
| JP | 2005-043021 A | 2/2005 |
| JP | 2007-013172 A | 1/2007 |

OTHER PUBLICATIONS

U.S. Non Final Office Action directed to related U.S. Appl. No. 11/389,493, filed Mar. 27, 2006, mailed Jul. 7, 2009; 17 pages.
U.S. Final Office Action directed to related U.S. Appl. No. 11/389,493, filed Mar. 27, 2006, mailed Jan. 26, 2010; 12 pages.
U.S. Notice of Allowance directed to related U.S. Appl. No. 11/389,493, filed Mar. 27, 2006, mailed Dec. 9, 2010; 8 pages.
Notice of Reasons for Rejection mailed Feb. 23, 2010 for Japanese Patent Application No. 2007-071761; 4 pages.

ASSEMBLY COMPRISING A CONDITIONING SYSTEM AND AT LEAST ONE OBJECT, A CONDITIONING SYSTEM, A LITHOGRAPHIC APPARATUS AND METHODS

CROSS REFERENCE TO RELATED APPLICATIONS

This application is a Continuation of U.S. patent application Ser. No. 11/389,493; filed Mar. 27, 2006, (that issued as U.S. Pat. No. 7,924,399 on Apr. 12, 2011), which is incorporated by reference herein in its entirety.

FIELD

The present invention relates to an assembly comprising a conditioning system and an object, a conditioning system, a lithographic apparatus, a method for conditioning an area, and a lithographic device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An assembly comprising a conditioning system and at least one object is known from the art. For example, European patent EP 0 498 499 illustrates, in FIG. 18 thereof, a part of a lithographic apparatus. The apparatus includes an interferometer system and a space in which respective interferometer beams propagate, near a movable substrate table. A constant, desirably laminar stream of gas (e.g., air) is passed through this space, to obtain a greater accuracy of the interferometer system. It is well known that, for interferometry beams propagating through a gas volume (such as air), the gas in the volume should be of extreme purity and have a uniform temperature to provide a substantially constant gas index of refraction for the propagating beam. Small changes in the gas refractive index may produce an unacceptable interferometry error. Both the purity and the temperature of the supplied gas can be controlled. In the case of air, the air is, for example, of purity class 1 and its temperature is, for example, stable to within 0.10 degrees C. or better.

SUMMARY

It is desirable to improve the assembly, wherein the conditioning system can condition a respective area well. Also, it is desirable to provide an improved conditioning system and method. Besides, it is desirable to provide an improved lithographic apparatus and method.

According to an embodiment of the invention, there is provided an assembly comprising a conditioning system and an object, the conditioning system comprising fluid outlet passages to supply conditioning fluid to an area to be conditioned, at least part of the object being moveable into and/or out of the area to be conditioned, wherein the conditioning system is configured to adjust outflow of the conditioning fluid from the fluid outlet passages depending on a position of the object.

According to an other embodiment, there is provided a conditioning system, comprising:
  a first fluid distribution chamber; and
  a second fluid distribution chamber comprising a plurality of fluid outlet passages in a downstream part of the second chamber, the fluid outlet passages configured such that, during use, the Reynolds number of fluid flowing through each of the fluid outlet passages is smaller than about 150,
  wherein the first distribution chamber comprises a fluid flow regulator configured to distribute fluid from the first chamber homogeneously into the second chamber, such that during use, an average pressure at an upstream inlet in the second chamber of each of the fluid outlet passages is at most about 50 Pa above a pressure at a respective downstream outlet side of the fluid outlet passage.

According to an embodiment, there is provided a lithographic apparatus, comprising an assembly according to an embodiment of the invention and/or a conditioning system according to an embodiment of the invention.

According to yet another embodiment, there is provided a method for conditioning an area, the method comprising:
  supplying conditioning fluid to an area to be conditioned using a plurality of fluid outlet passages of a conditioning system; and
  adjusting outflow of the conditioning fluid from the fluid outlet passages depending on a position of an object at least partly moveable into and/or out of the area to be conditioned.

According to another embodiment, there is provided a lithographic device manufacturing method, comprising:
  illuminating a target portion of a substrate with a patterned projection beam, the substrate being held by a substrate support;
  conditioning an area near the substrate support with a conditioning system comprising fluid outlet passages to supply conditioning fluid to the area to be conditioned;
  moving the substrate support at least partially into and/or out of the area to be conditioned; and
  varying outflow of the conditioning fluid from a number of the fluid outlet passages depending on a position of the substrate support.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
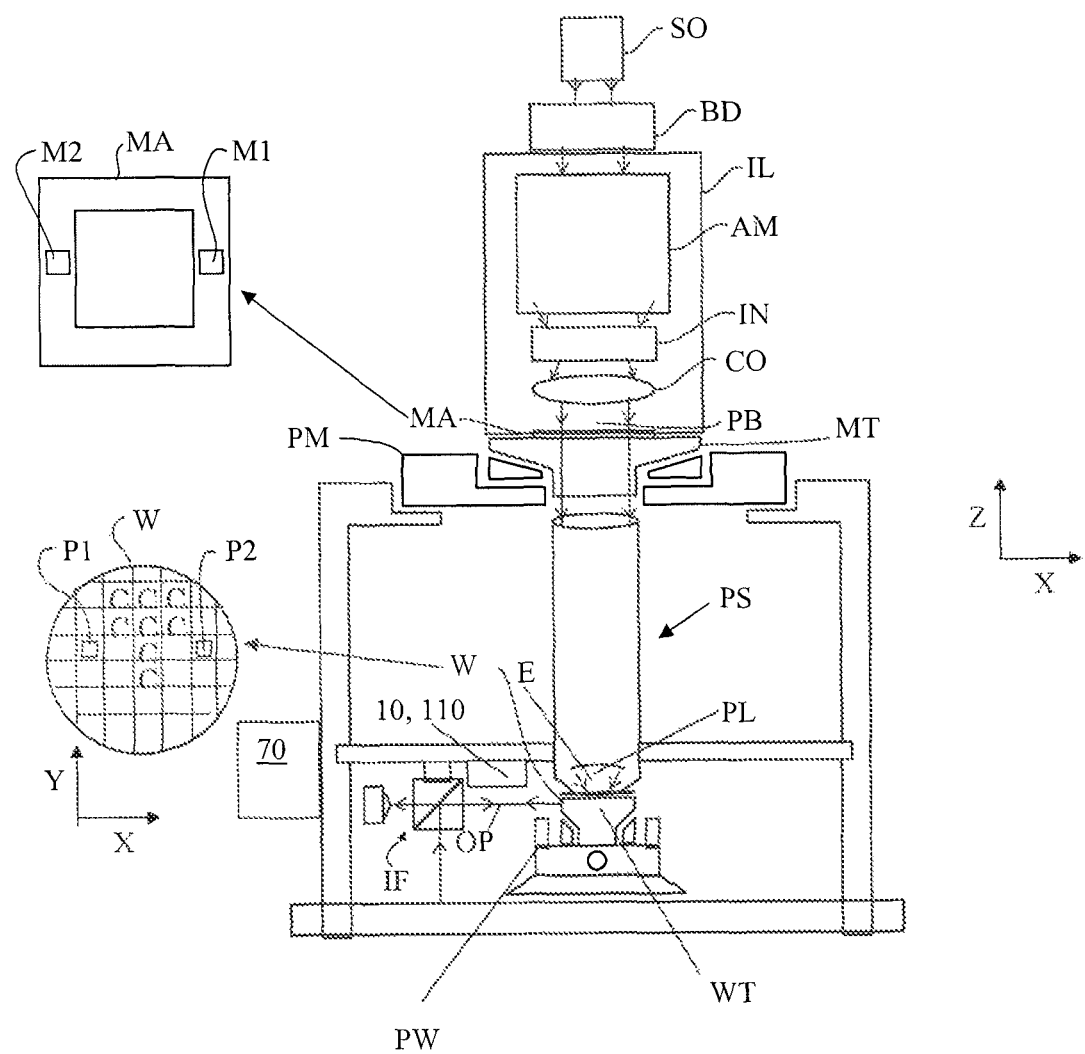
FIG. 1 schematically depicts an embodiment of a lithographic apparatus.

FIG. 1 schematically depicts an embodiment of a lithographic apparatus. The apparatus comprises:
- an illumination system (illuminator) IL configured to condition a radiation beam B (e.g. UV radiation or other radiation);
- a support structure (e.g. a mask table) MT constructed to support a patterning device (e.g. a mask) MA and connected to a first positioner PM configured to accurately position the patterning device in accordance with certain parameters;
- a substrate support (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the patter imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system", Furthermore, the term "optical system" used herein should be broadly interpreted as encompassing any type or wavelength of electromagnetic energy being controlled using optics or whatever means necessary for controlled operation.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device.

Having traversed the patterning device MA, the radiation beam B passes through the projection system PS, which focuses the beam onto a target portion C of the substrate W. With the aid of the second positioner PW and position sensor IF (e.g. an interferometric device IF, linear encoder or capacitive sensor), the substrate support (herein also called a substrate table) WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
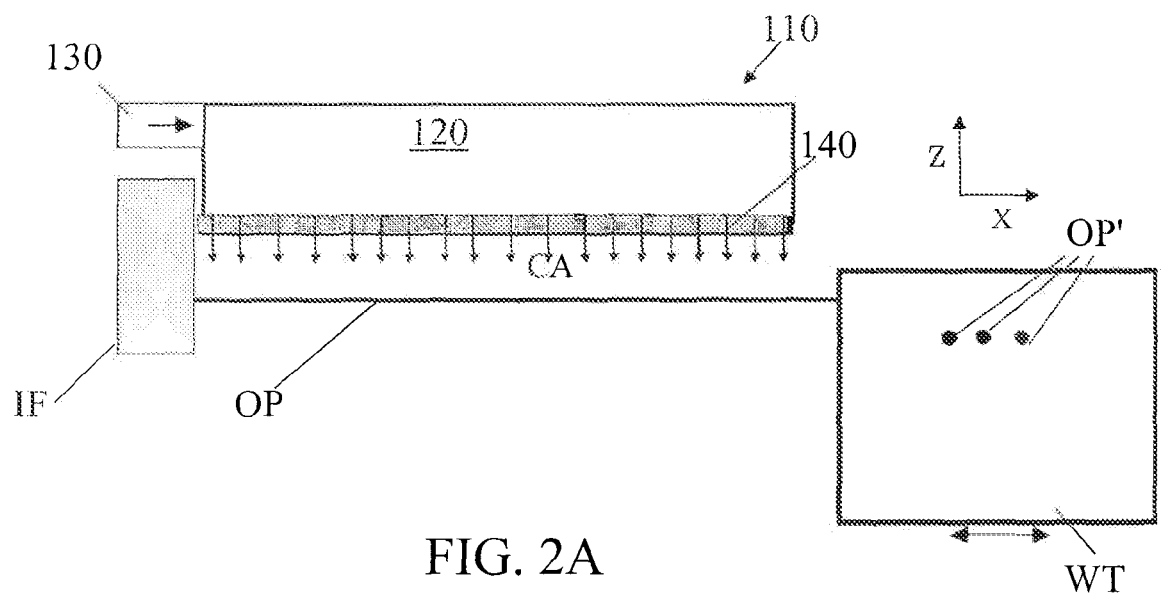
FIG. 2A schematically depicts a cross-section of part of the apparatus shown in FIG. 1, wherein a substrate support is in a first position.
Figure 2B:
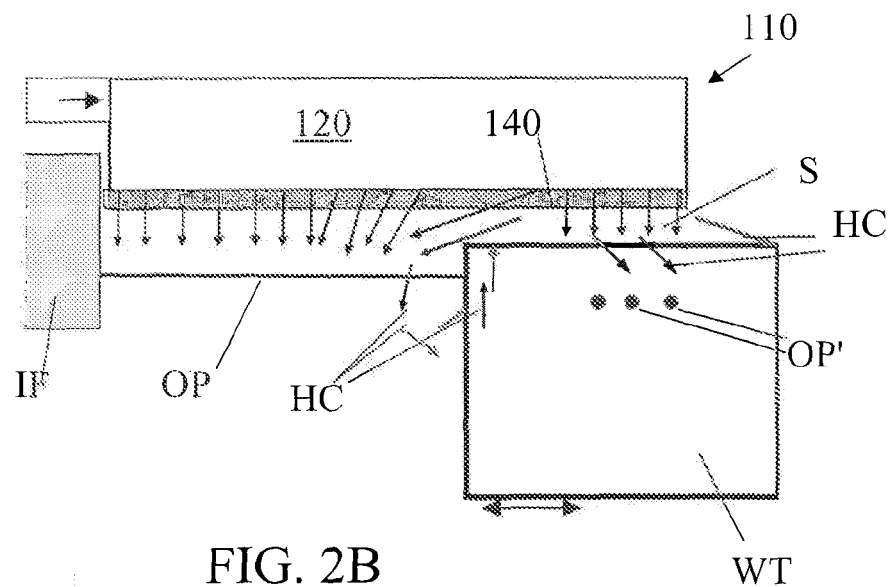
FIG. 2B is a view similar to FIG. 2A, wherein the substrate support is in a second position.
Figure 3:
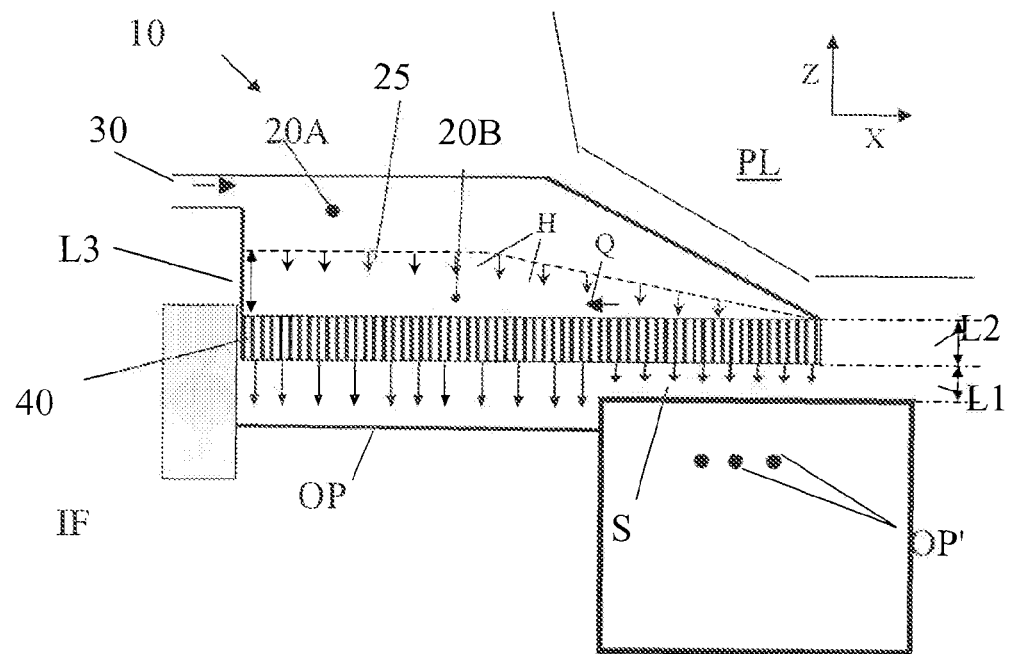
FIG. 3 is a view similar to FIG. 2B, depicting an embodiment of the invention.

In an embodiment, shown in FIG. 1, the apparatus can include one or more measuring systems IF, for example an interferometer system IF, as well as one or more conditioning systems 10, 110 configured to supply substantially laminar fluid, for example gas or a gas mixture, to at least part of an optical path OP of the mentioned measuring system IF. This is also depicted in FIGS. 2A, 2B, 3, which Figures show a detail of the apparatus shown in FIG. 1. In the present embodiment, a path OP to be conditioned may have a varied length, for example a length of over approximately 350 mm in a 300 mm wafer lithography scanner, with a maximum length of about 450 mm, and/or a different length, as will be clear to the skilled person.

In an embodiment, the conditioning system 10, 110 may be used to optically condition one or more optical paths OP in the lithographic apparatus. The conditioning may involve an optical conditioning, for example to prevent thermal variations in the optical path, particularly to provide an environment having a stable refractive index. Optical paths, for example of interferometer beams of a measuring system IF, are depicted in the Figures by reference signs OP. Such optical paths OP may run between various parts of the lithographic apparatus. For example, respective interferometer beams may be used to accurately position a substrate support WT with respect to a projection element PL of the projection system PS during use, for example in orthogonal X-, Y- and/or Z-directions (see also FIG. 1). In the embodiments shown in FIGS. 2 and 3, optical paths OP to be conditioned by the conditioning system 10, 110 extend between part of an interferometer system IF on one hand and a substrate support WT on the other hand. The respective conditioning system 10, 110, which may condition those optical paths OP during use, may extend between said part of the interferometer system IF on one hand and the substrate support WT and the projection element PL on the other hand. In the present embodiment, conditioning system 10, 110 does not extend on a side of the substrate support WT or projection element PL that is facing away from said part of the interferometer system IF. Thus, in the present embodiment, the conditioning system 10, 110 extends substantially on one lateral side of the projection element PL. However, one or more such conditioning systems may also be provided differently, for example in different locations of the apparatus and/or to condition other areas in the apparatus.

For example, the conditioning system 10, 110 may be configured to supply various types of gas to an area to be conditioned, for example one or more inert gases, nitrogen, a gas mixture or different gas types. In an embodiment, the gas is air, for example ultra clean air of purity class 1. The temperature of the gas may be relatively stable, for example, stable within 0.1 degrees C. and particularly stable within 0.001 degrees C. It is known from the prior art how such a thermally stable gas can be provided. Alternatively, for example, the conditioning fluid may comprise a liquid, or a gas/liquid mixture.

FIGS. 2 and 3 also depict other optical paths OP', extending for example orthogonally with respect to the above-mentioned optical paths OP, towards the substrate support WT. For example, these other optical paths OP' are not directly conditioned by the conditioning system 10, 110. One or more other conditioning systems (not depicted) may be provided to specifically condition these other optical paths OP'.

FIGS. 2A and 2B schematically depict an assembly comprising a conditioning system 110 and a moveable substrate support WT. Particularly, the substrate support WT is moveable at least in a direction substantially parallel to a downstream fluid outlet side of the conditioning system 110. The conditioning system comprises a gas shower 110, which includes a gas distribution chamber 120, having a gas inlet 130 and a gas outlet 140. The gas inlet 130 is coupled to one or more suitable fluid pumps, reservoirs and/or other means 70, to feed fluid to the system 10, 110.

During use of the system of FIGS. 2A and 2B, the gas shower 110 supplies large amounts of clean gas to a respective optical path OP, to be conditioned, via the gas outlet 140. Towards this aim, the pressure in the gas distribution chamber 120 is kept at a relatively high value to force the fluid through the gas outlet 140, wherein the gas outlet 140 may comprise, for example, a gas distributing membrane to provide a homogeneous distribution of the fluid. Flow of the conditioning gas from the gas shower is schematically indicated by arrows CA. For example, in FIG. 2, the pressure outside the gas distribution chamber 120 may be substantially atmospheric pressure, or a lower or higher pressure, wherein a pressure in the gas distribution chamber 120 may be at least 200 Pa higher than the pressure outside that chamber 120.

As is shown in FIGS. 2A and 2B, the substrate table WT, for example in combination with a substrate which is not depicted in FIGS. 2 and 3, is partly movable into and out of the area to be conditioned. In FIG. 2A, the substrate support WT has been moved over some distance away from the measuring system IF to a first position, so that the support WT does not extend opposite the outlet side of the conditioning system 110. In that case, the conditioning does not substantially direct gas towards the substrate support WT.

In FIG. 2B, the substrate support WT has been moved a distance towards the measuring system IF to a second position, such that the substrate support WT partly extends (in the Figure) below the conditioning system 110. In this case, the conditioning system 110 does direct gas CA onto the substrate support WT, forcing the gas into a slit S extending between the substrate support WT and the gas outlet 140 of the conditioning system 110. Therefore, a large amount of conditioning gas CA may be forced into the slit S and directed onto the substrate support WT (and/or a substrate in case a substrate is held by the substrate support WT). This gas is wasted from conditioning the optical path and acts as a disturbing force on conditioning of the optical path OP of the measuring system IF and other nearby optical paths OP'. Additionally or alternatively, the large amount of conditioning gas CA forced into the slit S may pick up heat and/or contaminants from the slit S, such as water, after which such heat and/or contaminants may be transported into the optical paths OP, OP' (this is indicated by arrows HC in FIG. 2B). Additionally or alternatively, when the substrate support is in the second position (FIG. 2B), an undesired jet of high velocity conditioning gas may result from the slit S, near the substrate support WT.

Figure 4:
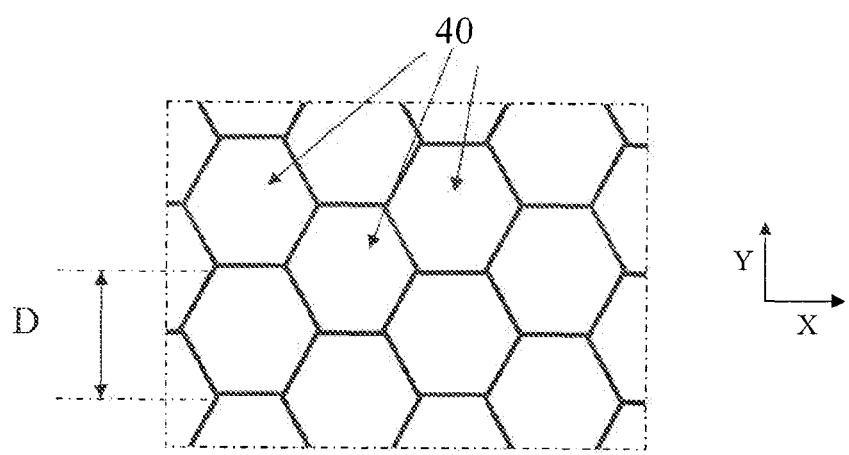
FIG. 4 is a cross-section of a number of fluid outlet passages of the embodiment shown in FIG. 3.

FIGS. 3 and 4 depict an embodiment of an assembly comprising a conditioning system 10, for example a gas shower, and a substrate support W of a lithographic apparatus. In the embodiment of FIGS. 3 and 4, the conditioning system 10 is configured to passively adjust outflow of the conditioning fluid from respective fluid outlet passages 40 depending on the position of the substrate support WT with respect to the passages 40. Alternatively, the conditioning system 10 can be configured to actively control the passages 40 to adjust outflow of the conditioning fluid. In the present embodiment, the substrate support WT and the conditioning system 10 are configured to cooperate with each other, for example via a slit S extending therebetween, to adjust the outflow of the conditioning fluid from a number of the passages 40.

The conditioning system 10 of the embodiment of FIGS. 2 and 3 comprises an upstream first fluid distribution chamber 20A and a downstream second fluid distribution chamber 20B. A relatively thin fluid flow regulator or fluid pre-conditioner 25 is arranged between the first and second chambers 20A, 20B. The fluid flow regulator 25 is configured to receive conditioning fluid from the first chamber 20A and to distribute the fluid homogeneously into the second chamber 20B. A downstream side of the second chamber 20B is provided with a number of fluid outlet passages 40 of the conditioning system 10, see FIG. 3. As a non-limiting example, at least a 100, or at least a 1000 passages 40 may be provided. FIG. 4 shows a number of these passages 40 in an example lateral cross-section. The conditioning system 10 may further be provided with a suitable fluid supply 30 to supply fluid to the first chamber 20A. The system may also comprise one or more pumps, reservoirs and/or other means to feed a desired amount of conditioning fluid to first chamber 20A, via the fluid supply 30, and to hold the first chamber 20A at a desired pressure. These pumps, reservoirs and/or other means are schematically indicated in FIG. 1 by item 70, are known as such from the art, and therefore are not described in detail.

During use of the embodiment of FIG. 3, an average pressure at an upstream inlet of each of the respective passages 40 in the second chamber 20B, may be at most about 50 Pa above a pressure at a respective downstream outlet side of the fluid passage. The fluid outlet passages may be configured such that, during use, the Reynolds number Re of fluid flowing through each of the fluid outlet passages is smaller than about 150. In a further embodiment, the conditioning system 10 is configured to hold the interior of the first chamber 20A at a relatively high overpressure, for example at least 100 Pa, with respect to the pressure in the second chamber 20B. For example, during use, the average pressure in the first chamber 20A may be about 150-200 Pa, or a higher pressure value, above an average pressure in the downstream second chamber 20B. One or more suitable fluid pumps, reservoirs and/or other means 70 may be constructed and controlled to provided for the mentioned pressure in the first chamber 20A, as will be clear to the skilled person.

Also or alternatively, the conditioning system 10 may be configured such that, during use, a pressure at an upstream inlet of each of the respective passages 40 in the second chamber 20B is at most about 10 Pa, for example about 5 Pa, above an average pressure at a respective downstream outlet side of the fluid passage (so that a pressure drop over a fluid outlet passage 40 is at most about 10 Pa).

The fluid flow regulator 25 may be configured in various ways. For example, the fluid flow regulator 25 may be a bottom side of the first chamber 20A and a top side of the second chamber 20B. The regulator 25 may be provided, for example, with a monofilament fabric, by a large number of fluid passages and/or a cloth layer, and/or with a sheet having suitable, small gas passages. In an embodiment, the fluid flow regulator 25 is designed to provide a relatively homogeneous, uniform fluid flow into the second chamber 20B from fluid which is at the mentioned relatively high pressure in the upstream first chamber 20A. Therefore, the fluid flow regulator 25 may operate at a relatively large pressure drop over the regulator 25, for example a pressure difference of at least 100-200 Pa, or a higher pressure drop. In an embodiment, fluid flow regulator 25 may comprise a particle filter and/or particle filtration medium.

The fluid outlet passages 40 may be or provide a kind, of 'purge fluid polarizer', which comprises multiple relatively long tubes 40 of a certain Reynolds number diameter. The conditioning fluid (for example gas) flows laminarly through these conditioning tubes 40, whose length may be designed to specifically attenuate all non-axial, gas velocity flow-vectors, as will be clear to the skilled person. Also, the long tubes or fluid outlet passages 40 may direct the conditioning fluid specifically towards the area to be conditioned, without a large pressure difference having to be applied over each of the passages 40.

In a further embodiment, the conditioning system may be configured such that, during use, a pressure at an upstream inlet of each of the respective fluid outlet passages is at most about 10 Pa above an average pressure at a respective downstream outlet side of the fluid outlet passage. The conditioning system 10 may be advantageously configured such that, during use, a static pressure at an upstream inlet of each of the respective fluid outlet passages 40 is about the same as an average dynamic pressure at a respective downstream outlet side of the passage 40. Good results may be obtained if the conditioning system is configured such that, during use, the Reynolds number Re of fluid flowing through each of the respective fluid passages 40 is smaller than about 20. Thus, a good and efficient cooperation between the conditioning system 10 and the moveable substrate support WT may be achieved, such that the substrate support WT may act as a contactless external flow restriction device of a number of the fluid outlet passages 40.

Figure 5:
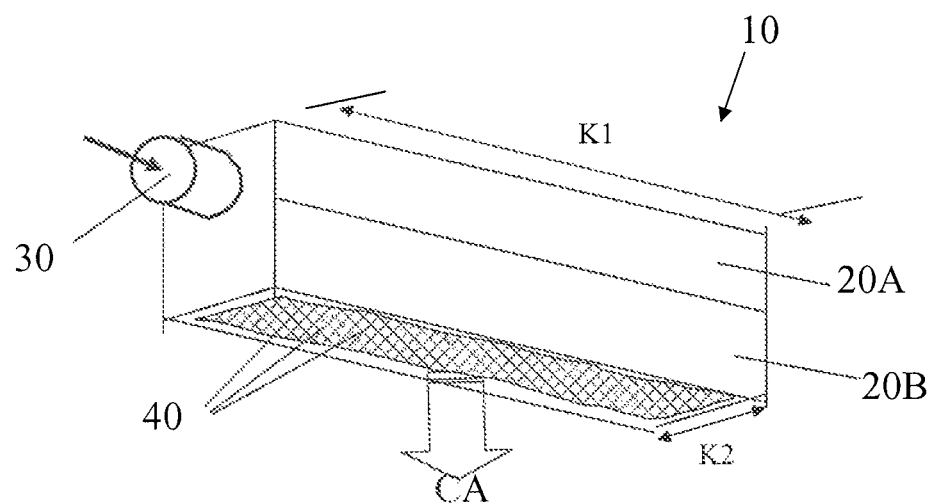
FIG. 5 schematically depicts a perspective view of an embodiment of the invention.

The fluid distribution chambers 20A, 20B may have various shapes and dimensions. For example, in the embodiment of FIG. 3, both the first and second chambers 20A, 20B include tapered parts or ends, which extend, for example, near an element PL of a projection system PS, such as a final optical element PL of the projection system. In this case, each of the first and second chambers 20A, 20B has a part having a varying lateral cross-section measured along directions which are substantially parallel to fluid outflow directions of the fluid outlet passages 40 (i.e., measured in the Z-direction in the Figures). FIG. 5 shows an alternative embodiment of the conditioning system, which is similar to the embodiment of FIGS. 3 and 4. In FIG. 5, the system comprises substantially rectangular, relatively flat, first and second chambers 20A, 20B.

Also in the present embodiments of FIGS. 3 to 5, a length K1 of the fluid distribution chambers 20A, 20B (measured in an X direction in the Figures) can be substantially the same as, or a bit larger than a maximum length of respective optical paths OP to be conditioned, or the region to be conditioned. For example, the mentioned length K1 may be in the range of about 20-50 cm, or a different length. A width K2 of the fluid distribution chambers 20A, 20B (measured in a Y-direction in the Figures) may be substantially smaller than the length K1. The width K2 may be, for example, in the range of about 4-15 cm, or a different width. An overall height of the fluid distribution chambers 20A, 20B (measured in a Z-direction in the Figures) may be substantially smaller than the width K2. The overall height K3 may be, for example, smaller than about 5 cm, or a different height. For example, each of the fluid distribution chambers 20A, 20B may be a relatively long, or elongated, chamber, which may have relatively small dimensions in transversal directions, particularly in a height direction perpendicular to optical paths OP to be conditioned, or a region to be purged. Also, in an embodiment, the height L3 of the second chamber 20B is smaller than the height of the first chamber 20A, viewed in a transversal cross-section of the system. As an example, a maximum height of the second chamber 20B, which does not include the height of the fluid outlet passages 40, may be about 1 cm, or a different value. Also, in an embodiment, the interior volume of the second chamber 20B may be about the same as or smaller than the interior volume of the upstream first chamber 20A. To the skilled person it will be clear that the fluid distribution chambers 20A, 20B may also be shaped and dimensioned differently.

In the embodiment of FIGS. 2 and 3, the substrate support WT may act as a movable shutter or moveable flow restrictor of at least part of the fluid outlet passages of the conditioning system. The substrate support WT may provide a contactless shutter, comprising a shutter side which is movable to a position opposite outlet sides of at least part of the fluid outlet passages 40 of the conditioning system 10—as is shown in FIG. 3—to restrict fluid flow from those outlet sides, without mechanically contacting the outlet sides of the passages 40. In other words, the substrate support WT (and, for example, a substrate held thereon) may be movable to and away from the downstream outlet sides of a first number of the passages 40 of the conditioning system 10. The conditioning system 10 is arranged such that the first number of the passages 40 of the conditioning system may discharge a certain (first) amount of conditioning fluid into the area to be conditioned when the substrate support WT has been moved away from the respective outlet sides of those passages 40, to a mentioned first position (see above and FIG. 2A). In case the substrate support WT has been moved to a respective second position (see FIGS. 2B and 3), such that part of the substrate support extends opposite the respective outlet sides of those passages 40, fluid flow from the first number of the passages 40 of the conditioning system 10 may be substantially restricted.

In an embodiment, a closest distance L1 between the substrate support WT and outlet sides of the fluid outlet passages 40 is relatively small. As is shown in FIG. 3, the closest distance L1 is the height of the slit S that extends between the substrate support WT and the outlet sides of the passages 40. For example, in the present embodiment, the height L1 of the slit S may be smaller than 5 mm, smaller than about 3 mm, or about 2.25 mm or smaller. Such a relatively small slit S may provide a good flow resistance to outflow from adjacent passages 40, for example in case the pressure in the second chamber 20B is kept at a mentioned relatively low value.

The interior cross-section of the second chamber 20B, measured in a plane substantially parallel to a YZ plane in the present Figures, may be larger than a smallest cross-section of the mentioned slit S, measured in the same plane, which slit S can extend between the second chamber 20B and the moveable substrate support WT. For example, in an embodiment, the smallest interior cross-section of the second chamber 20B, measured in a plane substantially parallel to a YZ plane in the present Figures, may be at least the same as or larger than the smallest cross-section of the mentioned slit S, measured in the same plane. As a non limiting example only, where the slit S has a height L1 of 2.5 mm and a width K2 of 10 cm, the smallest cross-section of the slit S may be 250 $mm^2$, and in that case, a smallest interior cross-section of the second chamber 20B, measured in the mentioned plane, may be at least 250 $mm^2$ or larger. However, one or more parts of the second chamber 20B may also have a smaller cross-section than the slit S, for example a tip part of the second chamber 20B, in the case that the chamber has a tapered shape (see FIG. 3).

The fluid outlet passages 40 of the conditioning system may be configured in various ways. In an embodiment, the passages 40 together provide a laminating flow tube assembly, which can feed a laminar, substantially homogeneous flow of conditioning fluid CA (for example, clean air) to the optical path OP, at above-mentioned pressures. For example, as is shown in FIG. 4, the passages 40 may have substantially honeycomb cross-sections, which may lead to good results. Alternatively or additionally, one or more of the passages 40 may have a different cross-section, such as a circular, a rectangular and/or other shape. Further, the passages 40 may have various dimensions. A length L2 of each of the passages 40 may be at least 10 to 30 times a diameter D of the respective passage. For example, the passages 40 may have diameters D in a range of about 0.1 mm-5 mm. A length of each of the passages 40 may be, for example, in the range of about 1-6 cm, and may particularly be about 1 cm. Moreover, in an embodiment, the passages 40 may have substantially the same diameter D, and be substantially parallel with respect of each other. Also, for example, the passages 40 may be designed to provide a substantially uniform laminar down flow (in the Z direction in the Figures) of a velocity, for example about 1 m/s or higher, or a velocity in the range of about 0.4-2.9 m/s, or a different velocity, at a mentioned pressure in the second chamber 20B or a mentioned pressure drop over these passages 40.

In an embodiment, for example, the length L2 of each of the passages 40 may be selected such that, during use, a reversal of flow through the passages (from the area to be conditioned, via the passages, into the second chamber 20B) is substantially prevented, at a certain operating pressure inside the second chamber 20B. In an embodiment, for example, the length L2 of each of the passages 40 may be such that, during use, only a minor temporary reversal of flow through the passages is experienced (at a certain operating pressure inside the second chamber 20B), for example due to a temporary pressure peak or pressure variation in the area near the outlets of the passages 40, wherein such minor reversal of flow through the passages does not lead to transport of fluid and/or particles from the area to be conditioned into the second chamber 20B.

In the present embodiment, the fluid outlet passages 40 each extend substantially orthogonal (in a Z direction in the drawing) with respect to a path OP to be conditioned. Alternatively, the passages 40 may be tilted with respect to the optical path. The passages 40 may also be shaped and dimensioned differently. The passages 40 may comprise a number of tubes, one or more bundles of capillaries, provided by a sheet having through-holes or bores, for example laser drilled holes, and/or provided in a different manner.

The assembly shown in FIG. 3 may be used, for example, during a device manufacturing method. As follows from the above (see also FIG. 1), the method may comprise illuminating a target portion of a substrate with a patterned beam, the substrate being held by the substrate support WT, and conditioning an area near the substrate support WT. During use, the substrate support WT may be moved at least partially into and out of the area to be conditioned.

To provide the conditioning of the optical path OP, a conditioning fluid, for example clean air, is fed to the first chamber 20A, via the fluid supply 30 and using one or more suitable fluid pumps, reservoirs and/or other means 70 to which the inlet 30 may be coupled. The conditioning fluid is held at such a pressure in the first chamber 20A, that the fluid flow regulator 25 can homogeneously, equally, distribute the fluid into the second chamber 20B (as is indicated by arrows H in FIG. 3). For example, the pressure in the first chamber 20A may be at least about 100 Pa or higher, or about 200 Pa or higher, than a pressure in the second chamber 20B, as mentioned above.

In an embodiment, the pressure in the second chamber 20B may be relatively low during use, as follows from the above. For example, a pressure at an upstream inlet of each of the respective fluid outlet passages 40 may be held at most about 50 Pa above an average pressure at a respective downstream outlet side of the passage 40. As an example, the latter pressure may be about the same as the average pressure in the area to be conditioned, which area is traversed by a beam of the measuring system in the present embodiment. Also, good results may be obtained in case a static pressure at an upstream inlet of each of the respective fluid outlet passages 40 is held at about the same value as, or slightly higher than, an average dynamic pressure at a respective downstream outlet side of the passage 40.

In an embodiment, for example, during a temporary pressure pulse in the area to be conditioned, the static pressure at an upstream inlet of each of the respective fluid outlet passages 40 may be temporarily below the instantaneous dynamic pressure at a respective downstream outlet side of the passage 40, which may lead to a minor, temporary backflow through that passage, such that potentially unconditioned fluid from the area to be conditioned enters one or more passages 40, but also such that the potentially unconditioned fluid from the area to be conditioned may not substantially reach into the second chamber 20B via passages 40. For example, in an embodiment, the movement of the substrate support WT towards the passages 40 might lead to such a temporary pressure pulse during use.

For example, the pressure in the downstream second chamber 20B may be such that a potential reversal of flow through the passages 40, for example due to a temporary pressure pulse or variation in the area to be conditioned, is prevented. Therefore, penetration of potentially unconditioned fluid from the area to be conditioned into the second chamber 20B, via passages 40, may be prevented, whereas a good conditioning of the optical path OP may be obtained. Particularly, for example, both a relatively low pressure inside the second chamber 20B in combination with a certain length L2 of the passages 40 may be such that a flow reversal through the passages 40 is substantially prevented during operation, or at least such that potentially unconditioned fluid, which might be present in the area to be conditioned, may not substantially reach the second chamber 20B via the passages 40.

In an embodiment, the (operating) pressure, during use, at the upstream inlet of each of the respective fluid outlet passages 40 is at most about 10 Pa above a pressure at the respective downstream outlet side of the passage 40. For example, the overall pressure in the second chamber 20B may be at most about 10 Pa above an average pressure in the area to be conditioned. The Reynolds number Re of fluid flowing through each of the respective fluid outlet passages 40 of the conditioning system 10 may be smaller than about 150 (Re<150), and may be smaller than 20 (Re<20). To the skilled person it will be cleat how such a Reynolds number may be obtained, depending for example on the conditioning fluid to be used.

Thus, a substantially homogeneous, substantially laminar flow of conditioning fluid CA from the fluid outlet passages 40 towards the optical path OP may be provided. Also, outflow of the conditioning fluid CA from the fluid outlet passages 40 may depend on a position of the substrate support WT, where there is a passive control of the distribution of the conditioning fluid over the passages 40.

In an embodiment, the fluid flow regulator 25 may provide a high pressure drop layer, and the fluid outlet passages 40 may provide a low pressure drop layer. The conditioning system 10 and the substrate support WT may cooperate with each other, to vary the flow of fluid CA from at least a number of the fluid outlet passages 40, depending on the position of the object with respect to those passages 40. Particularly, when the substrate support WT has been moved to the mentioned second position, the substrate support WT extends at short distance from the downstream ends of a number of the outlet passages 40 (see FIG. 3), such that fluid flow from these passages 40 is substantially reduced or blocked by the substrate support WT. The substrate support WT may act as a contactless shutter, or flow reducer, of those fluid passages 40 opposite which the substrate support WT extends when the support WT is in the second position (see FIG. 3). Herein, the substrate support WT (and a substrate that might be supported thereon) defines a small slit S with the opposing fluid outlet passages 40 of the conditioning system, which passages 40 extend towards the slit S. The slit S may provide a flow resistance to outflow from those passages 40, thus reducing such outflow. Due to a low pressure in the second chamber 20B, the conditioning system may passively, and substantially, reduce outflow from the fluid outlet passages 40 under influence of the flow resistance provided by the slit S. The flow of fluid inside the second chamber 20B towards the substantially blocked passages 40 may be redirected in the second chamber 20B towards other outlet passages 40 to condition the optical path OP. Such a redirection is indicated by an arrow Q in FIG. 3.

In this way, significant amounts of conditioning fluid CA may not be directed onto the substrate support WT (and/or a substrate in case a substrate is held by the substrate support WT). Therefore, pick up of heat and/or contaminants from substrate support WT may be prevented relatively well, and an undesired jet of high velocity conditioning fluid near the substrate support WT may be prevented or diminished substantially. Thus, in the present embodiment, the optical path OP may be optically conditioned well, wherein thermal variations in the optical path OP may be reduced. Also or alternatively, transport of heat and/or contaminants, for example, from the substrate support. WT or slit S towards other optical paths OP' may be prevented in this way. Also or alternatively, the present conditioning system 10 may be more economical and efficient regarding the consumption of the conditioning fluid. Further, the conditioning system may be made relatively compact, particularly having a relatively small overall height (in the Z-direction in the Figures).

A conditioning system as described herein may be applied in various ways. For example, the conditioning system may be used to condition one or more optical paths OP, and/or other areas. The conditioning system may provide a gas curtain, for example, in a wafer stage, wafer handling system and/or during interferometry measurements. The conditioning system may be applied in a lithography apparatus and/or process, or in an other type of apparatus and/or process, for example in any apparatus and/or process wherein one or more areas should be thermally and/or optically conditioned. As an example, a 3D measuring device, an interferometer measuring device, a switching pressure chamber and/or other devices may be provided with a conditioning system as described herein.

In the non-limiting embodiments described above, the conditioning system 10 is be configured to passively vary outflow of the conditioning fluid. Alternatively or additionally, the conditioning system may be configured to actively control outlet passages 40 to adjust outflow of the conditioning fluid. For example, each of the passages 40 may be provided with a valve to close the respective passage 40 in case the substrate support has been moved to a position opposite those passages 40. Such a valve may be located, for example, at an inlet or downstream outlet of the passage 40, or within the passage 40. Alternatively or additionally, for example, the conditioning system may be provided with a movable shutter device, which can shut a plurality of the fluid outlet passages 40, depending on the position of the substrate support WT with respect to the passages 40. The conditioning system may also be configured in a different manner.

Although specific referenced may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "comprising" does not exclude other elements or steps. Also, each of the terms "a" and "an" does not exclude a plurality. Also, a single processor or other unit may fulfill functions of several means recited in the claims. Any reference sign(s) in the claims shall not be construed as limiting the scope of the claims.

For example, the term "an area" concerning an area to be conditioned should be interpreted broadly, and may comprise a volume, a volume space, a space, a region and/or other similar terms. Similarly, for example, the term "a space" concerning a space to be conditioned should be interpreted broadly, and may comprise a volume, a volume space, an area, a region and/or other similar terms.

The invention claimed is:

1. A measuring system for measuring a relative position of an object, comprising:
a conditioning system, the conditioning system comprising fluid outlet passages to supply conditioning fluid to an area to be conditioned, with at least a part of the object being movable into and/or out of the area to be conditioned, wherein the conditioning system is configured to adjust an outflow of the conditioning fluid from the fluid outlet passages depending on a location of the object, and wherein the conditioning system is configured such that, during use, a static pressure at an upstream inlet of at least one of the fluid outlet passages is about the same as a dynamic pressure at a respective downstream outlet side of the fluid outlet passage; and
an interferometer device configured to measure the relative position of the object by using an optical beam that passes, at least in part, through the area to be conditioned.

2. The measuring system of claim 1, wherein the object and the conditioning system are configured to cooperate with each other to adjust the outflow of the conditioning fluid from a number of the fluid outlet passages.

3. The measuring system of claim 2, wherein the object is arranged to be a contactless shutter, comprising a shutter side which is movable to a position opposite outlet sides of at least a plurality of the fluid outlet passages to restrict fluid flow from out of those fluid outlet passages without mechanically contacting the outlet sides.

4. The measuring system of claim 1, wherein the object is at least movable to and away from outlet sides of a first number of the fluid outlet passages, wherein the conditioning system is arranged such that the first number of the fluid outlet passages can discharge an amount of conditioning fluid into the area to be conditioned when the object has been moved away from the outlet sides, and such that fluid flow from the first number of the fluid outlet passages of the conditioning system can be substantially restricted when the object has been moved to the outlet sides.

5. The measuring system of claim 1, wherein the conditioning system is configured such that, during use, a pressure at an upstream inlet of each of the fluid outlet passages is at most about 50 Pa above a pressure at a respective downstream outlet side of the fluid outlet passage.

6. The measuring system of claim 1, wherein the conditioning system is configured such that, during use, a pressure at an upstream inlet of each of the fluid outlet passages is at most about 10 Pa above a pressure at a respective downstream outlet side of the fluid outlet passage.

7. The measuring system of claim 1, wherein the conditioning system is configured such that, during use, a static pressure at an upstream inlet of each of the fluid outlet passages is about the same as a dynamic pressure at a respective downstream outlet side of the fluid outlet passage.

8. The measuring system of claim 1, wherein the conditioning system is configured such that, during use, a Reynolds number of fluid flowing through each of the fluid outlet passages is smaller than about 150.

9. The measuring system of claim 1, wherein the conditioning system is configured such that during use, a Reynolds number of fluid flowing through each of the fluid outlet passages is smaller than about 20.

10. The measuring system of claim 1, wherein a length of each of the fluid outlet passages is at least 10 to 30 times a diameter of the respective fluid passage.

11. The measuring system of claim 1, wherein the location of the object is such that the object and the conditioning system define a slit, the slit configured to provide a flow resistance to outflow of fluid from fluid outlet passages which adjoin the slit, and wherein the conditioning system is configured to substantially reduce outflow from the fluid outlet passages which adjoin the slit under influence of the flow resistance provided by the slit.

12. The measuring system of claim 1, wherein each of the fluid outlet passages has a honeycomb cross-section.

13. The measuring system of claim 1, wherein the conditioning system comprises a first fluid distribution chamber, a second fluid distribution chamber, and a flow regulator configured to homogeneously distribute fluid from the first chamber into the second chamber, wherein the fluid outlet passages are provided by a downstream part of the second chamber.

14. The measuring system of claim 13, wherein the conditioning system is configured to hold the first chamber at a relatively high overpressure with respect to the second chamber.

15. The measuring system of claim 13, wherein the fluid flow regulator is provided by a large number of fluid passages, a cloth layer, or both, extending between the first and second chambers.

16. The measuring system of claim 13, wherein at least one of the first and second chambers has a varying lateral cross-section.

17. The measuring system of claim 1, wherein the object is configured to hold or support a substrate.

18. The measuring system of claim 1, wherein a length of at least one of the fluid outlet passages is configured such that, during use, non-axial fluid velocity flow vectors of the outflow of the conditioning fluid is substantially attenuated.

19. The measuring system of claim 1, wherein a closest distance between the object and outlet sides of the fluid outlet passages is smaller than 5 mm.

20. The measuring system of claim 13, wherein a length of at least one of the fluid outlet passages is selected such that a temporary pressure pulse in the area to be conditioned does not substantially lead to potentially unconditioned fluid to reach the second chamber via the respective outlet passage.

* * * * *